United States Patent [19]
Chen et al.

[11] Patent Number: 5,523,624
[45] Date of Patent: Jun. 4, 1996

[54] INTEGRATED CIRCUIT DEVICE STRUCTURE WITH DIELECTRIC AND METAL STACKED PLUG IN CONTACT HOLE

[75] Inventors: Fusen E. Chen, Dallas; Robert O. Miller, The Colony; Girish A. Dixit, Dallas, all of Tex.

[73] Assignee: SGS-Thomson Microelectronics, Inc., Carrollton, Tex.

[21] Appl. No.: 112,863

[22] Filed: Aug. 26, 1993

Related U.S. Application Data

[63] Continuation of Ser. No. 843,822, Feb. 28, 1992, abandoned.

[51] Int. Cl.$^6$ .......................... H01L 29/417; H01L 29/43
[52] U.S. Cl. .......................... 257/751; 257/754; 257/763; 257/764; 257/767; 257/915
[58] Field of Search ........................ 257/754, 755, 257/773, 915, 763, 764, 750, 759, 751, 752, 765

[56] References Cited

U.S. PATENT DOCUMENTS

| | | | |
|---|---|---|---|
| 4,782,380 | 11/1988 | Shankar et al. | 257/915 |
| 4,800,176 | 1/1989 | Kakumu et al. | 257/750 |
| 4,833,519 | 5/1989 | Kawano et al. | 257/755 |
| 4,884,123 | 11/1989 | Dixit et al. | 257/915 |
| 4,976,839 | 12/1990 | Inoue | 257/915 |
| 4,994,410 | 2/1991 | Sun et al. | 257/915 |

FOREIGN PATENT DOCUMENTS

| | | | |
|---|---|---|---|
| 0196142 | 8/1989 | Japan | 257/915 |
| 0270347 | 10/1989 | Japan | 257/757 |
| 0201482 | 9/1991 | Japan | 257/767 |

*Primary Examiner*—Peter Toby Brown
*Attorney, Agent, or Firm*—Lisa K. Jorgenson; Kenneth C. Hill; Robert Groover

[57] ABSTRACT

A method is provided for patterning a submicron semiconductor layer of an integrated circuit, and an integrated circuit formed according to the same. A conductive structure is formed on the integrated circuit. A dielectric layer is formed over the integrated circuit. A contact opening is formed in the dielectric layer exposing a portion of the underlying first conductive structure. A barrier layer is formed on the dielectric layer and in the contact opening. A substantially conformal layer is formed over the barrier layer and in the contact opening. The conformal layer is partially etched away wherein the conformal layer remains only in a bottom portion of the contact opening. A second conductive layer is formed over the barrier layer and the remaining conformal layer.

32 Claims, 2 Drawing Sheets

INTEGRATED CIRCUIT DEVICE STRUCTURE WITH DIELECTRIC AND METAL STACKED PLUG IN CONTACT HOLE

This is a continuation of application Ser. No. 07/843,822, filed 02/28/92, now abandoned.

FIELD OF THE INVENTION

The present invention relates generally to semiconductor integrated circuit processing, and more specifically to an improved method of forming submicron contacts.

BACKGROUND OF THE INVENTION

The trend to continue to miniaturize semiconductor integrated circuits to achieve submicron feature sizes and increase the number of devices fabricated on the integrated circuit has required smaller isolation areas between devices. In addition, step coverage has posed a major problem for integrated circuit manufacturers even into the late 1980s. Poor step coverage can be found at the sharp vertical step metal to substrate contacts, metal to metal vias, and metal crossovers. As dimensions shrink, conventional techniques used to improve step coverage fall short of expectations and are limited to stringent design criteria.

Forming reliable submicron contacts for integrated circuit applications has received widespread attention in the microelectronics industry. Metal films, for example, are used extensively for surface wiring. The metallization process of wiring components together begins with etching contact openings or vias through the various layers down to the active regions within a semiconductor substrate, or to contact an underlying polycrystalline silicon or a metal interconnect layer. A conductive metal is then deposited over the surface of the wafer in a manner that provides good contact with the underlying active devices. Increasing chip density and smaller geometries have decreased the available area for surface wiring.

Because of its physical properties, aluminum is especially well suited for fabrication of metal interconnects. Among the properties which make aluminum so useful is the fact that it is very conductive, it forms a good mechanical bond with various dielectric layers generally used in the semiconductor industry, and it makes a good ohmic contact with both N and P type semiconductors. However, the sputtering process used to apply aluminum thin film layers to an integrated circuit generally results in less than ideal filling of contact vias. Large aluminum grains tend to form on the upper surface of the insulating layer. These grains which form at the edges of the contact via tend to block the contact opening before the aluminum has a chance to completely fill the contact via. This blockage produces a thinner layer of aluminum along the sides of the insulating layer, resulting in voids and uneven structures within the via. This blockage also leads to non-uniform current densities in the metal interconnect. This problem is enhanced as circuit devices are fabricated using smaller geometries.

The uneven thickness of the aluminum layer going into the via, caused by the step coverage problem described above, has an adverse impact on device functionality. If the voids in the via are large enough, contact resistance can be significantly higher than desired. In addition, the thinner regions of the aluminum layer will be subject to the well known electromigration problem. This problem can cause eventual open circuits at the contacts and premature failure of the devices. The devices must be designed so that the current density in the aluminum interconnect lines does not become high enough to cause rapid electromigration. The thinner regions of the aluminum layer tend to occur over abrupt height changes on the surface of the integrated circuit. Many approaches have been used to try to ensure good metal contact to lower interconnect levels. For example, refractory metal layers have been used in conjunction with the aluminum interconnect layer to improve conduction through a via. Sloped via sidewalls have been used to improve metal filling in the via. The use of sloped sidewalls is becoming less common as device sizes shrink because they consume too much area on a chip.

Even with these techniques, the problems of completely filling a via with aluminum are not solved. In part, this is due to the fact that aluminum is deposited at a temperature which tends to encourage fairly large grain sizes. Voids and other irregularities within the contact continue to be problems with current technologies.

It would be desirable to provide a technique for manufacturing reliable submicron contacts for integrated circuits whereby contact openings are completely filled improving coverage in contact vias. It would further be desirable to provide a technique for plugging the contact opening to achieve improved step coverage and reliable devices. It is further desirable that such a technique be compatible with current standard process flows.

SUMMARY OF THE INVENTION

The invention may be incorporated into a method for forming a semiconductor device structure, and the semiconductor device structure formed thereby, by forming a contact opening in a first dielectric layer exposing a portion of an underlying first conductive layer. A barrier layer is formed over the integrated circuit and in the contact opening. A dielectric plug is then formed in the bottom of the contact opening. A second conductive region is formed over the barrier layer and in the contact opening.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
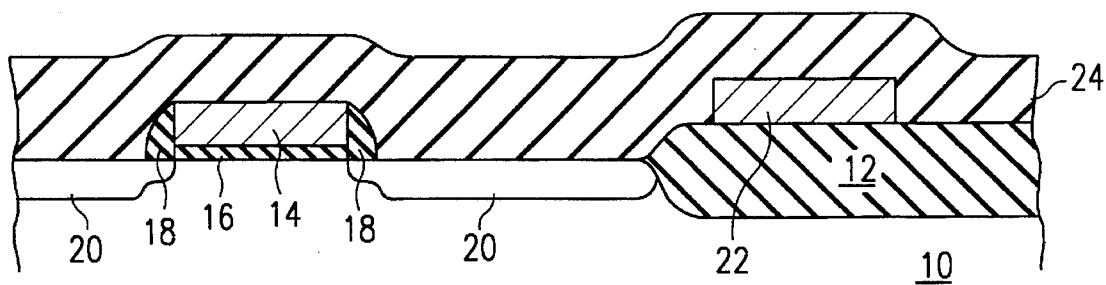
FIGS. 1–4 are cross-sectional views of the fabrication of a semiconductor device structure according to the present invention.

Referring to FIG. 1, an integrated circuit device is to be formed on a silicon substrate 10. A field oxide region 12 is formed on the substrate to separate active areas. A conductive structure such as a transistor gate is formed on the substrate by known methods comprising gate electrode 14 disposed over a gate oxide 16. The transistor will also comprise oxide spacers 18 and source/drain regions 20. Another conductive structure 22 such as a polysilicon signal line may be formed over the field oxide region 12. A conformal dielectric layer 24 is formed over the integrated circuit. This dielectric layer may be borophosphorous silicate glass (BPSG), typically having a thickness of between approximately 5000 to 10000 angstroms. The BPSG layer 24 is then generally reflowed to form a more planarized layer.

Figure 2:
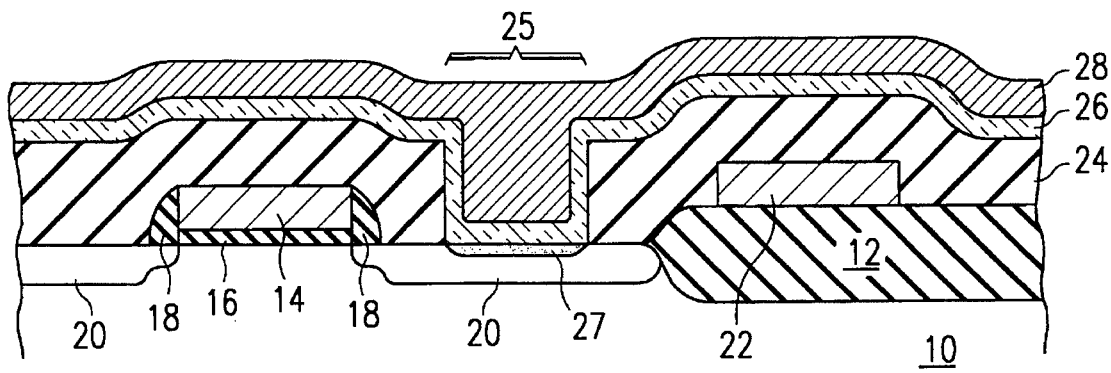

Referring to FIG. 2, a contact opening 25 is formed. A photoresist layer (not shown) is formed over the dielectric layer and patterned by methods known in the art. The dielectric layer 24 is etched using a dry, anisotropic etch process to form the contact opening 25 through the dielectric layer 24 exposing the underlying conductive structure 20. The photoresist layer would then be removed. A conformal barrier layer 26 is then formed over the dielectric layer 24 and in the opening 25. Barrier layer 26 is typically a refractory metal nitride such as titanium nitride or a titanium/titanium nitride composite or a tungsten/titanium nitride composite having a thickness between approximately 500 to 3000 angstroms. The barrier layer is typically formed by deposition techniques such as sputtering or chemical vapor deposition. Once the barrier layer has been formed, it is annealed to form a silicide in the bottom of the contact opening which repairs crystal damage in the substrate. This annealing process also activates the dopants. The titanium nitride is annealed after formation. The titanium deposited before the titanium nitride, if formed, may be annealed before the titanium nitride is deposited. A conformal layer 28 is formed over the barrier layer 26 and in the opening 25. Conformal layer 28 may comprise an oxide or polysilicon having a thickness of between 1000 to 4000 angstroms. The use of a high temperature oxide, ie, less than 800° C., or the use of polysilicon conforms to the underlying terrain thus completely filling the contact opening.

Figure 3:
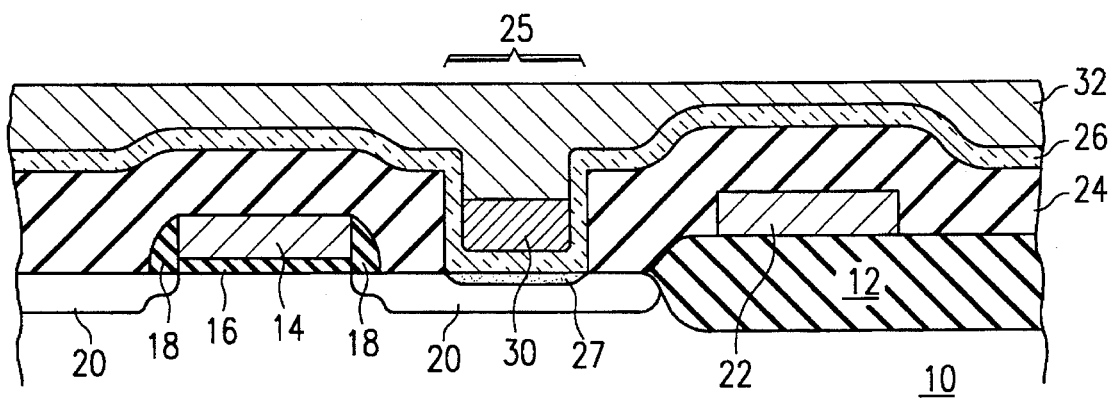

Referring to FIG. 3, conformal layer 28 is etched back so that only a plug 30 remains in the bottom of the contact opening. The barrier layer 26 acts as an etch stop during the step which etches the conformal layer 28. The amount of the plug remaining in the contact opening depends in part on the material used to form the plug and its resulting capacitance. A conductive layer 32 is then formed over the integrated circuit. The conductive layer 32 may be aluminum, an aluminum alloy or tungsten.

Figure 4:
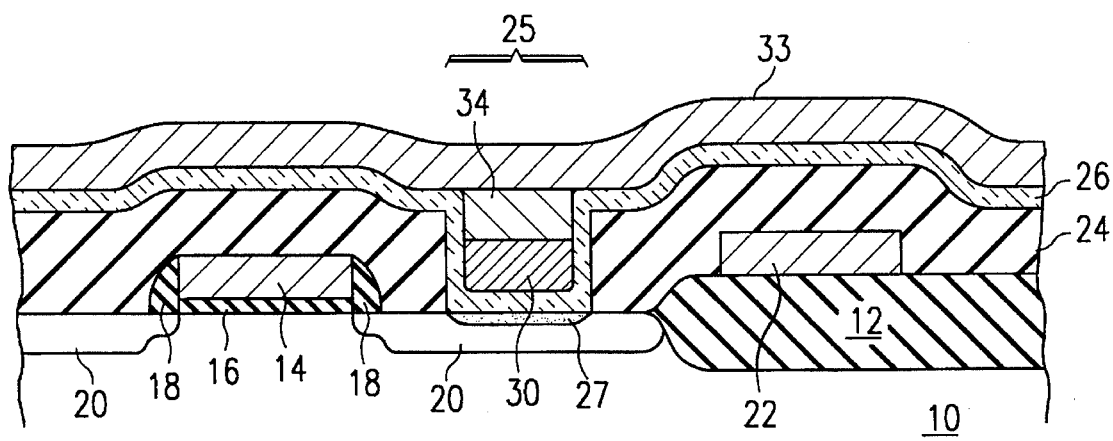

Referring to FIG. 4, the conductive layer 32 may be etched back to form a conductive plug 34 in the opening 25 and on top of the plug 30. If layer 32 is etched back it may form a more planar surface for subsequently formed layers 33.

Figure 5:
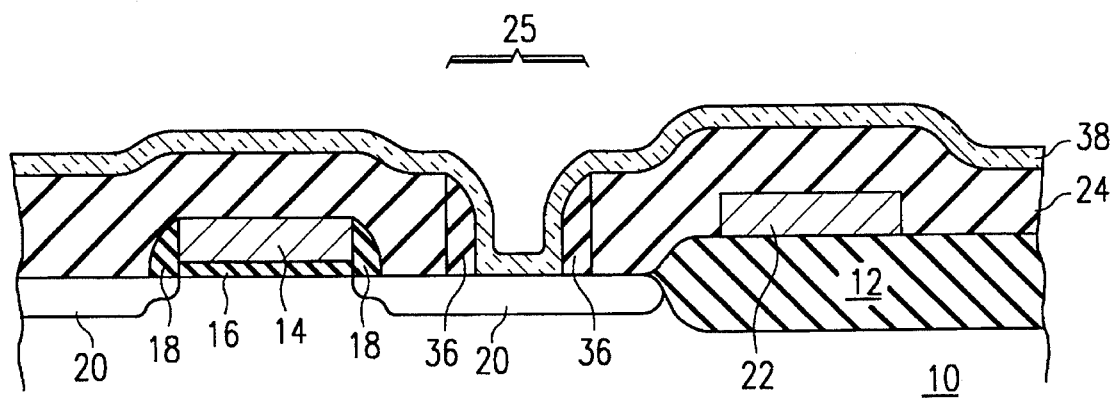
FIGS. 5–6 are cross-sectional views of an alternative fabrication of a semiconductor device structure according to the present invention.

Referring to FIG. 5, an alternative method of forming a contact opening and plug is shown. A polysilicon layer is formed over the first dielectric layer 24 and in the opening 25. This polysilicon layer is then etched back to form sidewall polysilicon spacers 36 along the sidewalls of the contact opening 25. A barrier layer 38 is formed according to the process steps described above.

Figure 6:
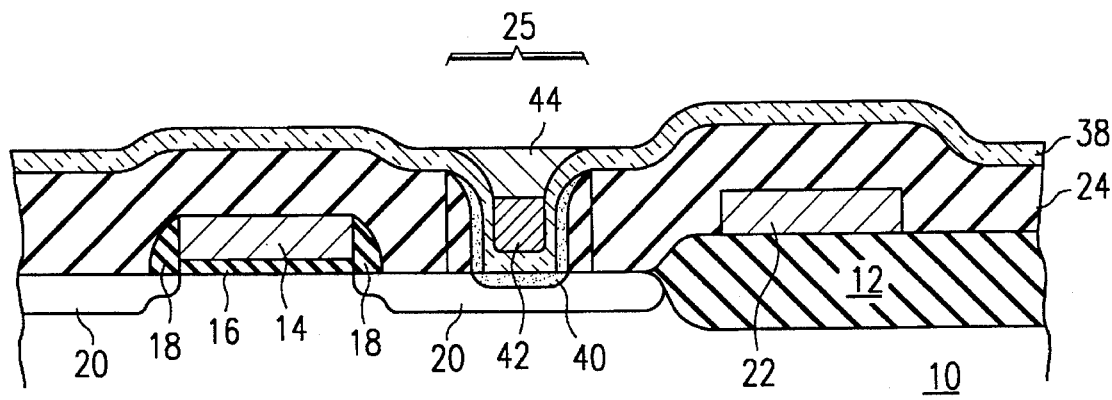

Referring to FIG. 6, the barrier layer is annealed to form a silicide region 40 along the polysilicon sidewalls and in the bottom of the contact opening. A plug 42 and a conductive layer 44 are formed according to the process steps described above. The conductive layer 44 may also be etched back to form a conductive plug, as shown.

Forming a plug in the bottom of the contact opening has several advantages. The plug further separates aluminum from the substrate, thus acting as an additional barrier to prevent spiking. The aspect ratio (step height/contact diameter) of the contact opening is much smaller after the dielectric plug is formed. Aluminum can then be deposited at higher temperatures with greater step coverage. The current "crowding" effect tends to confine most of the current to the periphery or the walls of the conductive material in a contact opening. Therefore, forming a plug from such materials as oxide or polysilicon for a nonconducting cylinder in the contact opening does not significantly change the current flow path. The current will flow through the conductive material around the plug taking the path of least resistance. Thus, the plug has little impact on device performance. Even though the introduction of the plug may change the electrical conductance of the interconnect structure, however, in submicron devices, this change will be relatively insignificant.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. A structure consisting of a portion of a semiconductor device, comprising:

a dielectric layer having an opening therethrough exposing a portion of an underlying conductive structure;

a first silicide region disposed in the underlying conductive structure at the bottom of the opening;

a conductive barrier layer disposed over the dielectric layer and covering sides and a bottom of the opening;

a dielectric plug filling a lower portion of the opening; and a conductive plug overlying said dielectric plug, and filling an upper portion of the opening;

wherein at least a portion of said conductive plug is formed below an upper surface of said dielectric layer;

a conductive layer disposed over a portion of the barrier layer and the dielectric and conductive plugs, wherein current is conducted between the conductive layer and the underlying conductive structure substantially entirely through the barrier layer.

2. The structure of claim 1, wherein the barrier layer comprises a refractory metal nitride layer.

3. The structure of claim 2, wherein the refractory metal nitride comprises titanium nitride.

4. The structure of claim 2, further comprising:

a refractory metal layer disposed under the refractory metal nitride layer.

5. The structure of claim 4, wherein the refractory metal layer comprises titanium.

6. The structure of claim 4, wherein the refractory metal layer comprises tungsten.

7. The structure of claim 1, wherein the dielectric plug comprises oxide.

8. The structure of claim 1, wherein the dielectric plug comprises polysilicon.

9. The structure of claim 1, wherein the underlying conductive structure comprises an active region in a semiconductor substrate.

10. The structure of claim 1, wherein the dielectric plug extends from the barrier layer in the bottom of the opening to a position below an upper surface of the dielectric layer.

11. The structure of claim 10, wherein the dielectric plug extends approximately halfway to the dielectric layer upper surface.

12. The structure of claim 1, wherein said barrier layer and said conductive plug are made of different materials.

13. An integrated circuit device structure, comprising:

a dielectric layer having an opening therethrough exposing a portion of an underlying conductive structure;

a conductive barrier layer disposed over the dielectric layer and covering sides and a bottom of the opening;

a dielectric plug filling a lower portion of the opening; and a conductive plug overlying said dielectric plug, and filling an upper portion of the opening;

wherein at least a portion of said conductive plug is formed below an upper surface of said dielectric layer;

a patterned thin-film metallization layer disposed over a portion of the barrier layer and the dielectric and conductive plugs, wherein at least a portion of the primary conduction path between said metallization layer and said underlying conductive structure is provided solely by said barrier layer.

14. The structure of claim 13, wherein said dielectric layer comprises borophosphosilicate glass.

15. The structure of claim 13, wherein said dielectric layer comprises a silicate glass.

16. The structure of claim 13, wherein said dielectric plug consists essentially of an oxide.

17. The structure of claim 13, wherein said dielectric plug consists essentially of polysilicon.

18. The structure of claim 13, wherein said dielectric layer has a thickness of approximately 5000 to 10000 Ångstroms and said dielectric plug has a thickness of between 1000 and 4000 Ångstroms.

19. The structure of claim 13, wherein said barrier layer comprises a metal nitride.

20. The structure of claim 13, wherein said barrier layer consists essentially of a material selected from the group consisting of: titanium nitride, composite of titanium with titanium nitride, and composite of titanium nitride with tungsten.

21. The structure of claim 13, further comprising a metal silicide layer interposed between said barrier layer and said underlying conductive structure.

22. The structure of claim 13, wherein said barrier layer and said conductive plug are made of different materials.

23. An integrated circuit device structure, comprising;

a dielectric layer having an opening therethrough exposing a portion of an underlying conductive structure;

a conductive barrier layer disposed over the dielectric layer and covering sides and a bottom of the opening;

a dielectric plug filling a lower portion of the opening; and a conductive plug overlying said dielectric plug, and filling an upper portion of the opening;

wherein at least a portion of said conductive plug is formed below an upper surface of said dielectric layer;

a patterned thin-film metallization layer overlying said conductive plug, wherein essentially all current between said metallization layer and said underlying conductive structure passes through said barrier layer.

24. The structure of claim 23, wherein said dielectric plug consists essentially of an oxide.

25. The structure of claim 23, wherein said dielectric plug consists essentially of polysilicon.

26. The structure of claim 23 wherein said dielectric layer has a thickness of approximately 5000 to 10000 Ångstroms and said dielectric plug extends has a thickness of between 1000 and 4000 Ångstroms.

27. The structure of claim 23, wherein said dielectric layer comprises borophosphosilicate glass.

28. The structure of claim 23, wherein said dielectric layer comprises a silicate glass.

29. The structure of claim 23, wherein said barrier layer comprises a metal nitride.

30. The structure of claim 23, wherein said barrier layer consists essentially of a material selected from the group consisting of: titanium nitride, composite of titanium with titanium nitride, and composite of titanium nitride with tungsten.

31. The structure of claim 23, further comprising a metal silicide layer interposed between said barrier layer and said underlying conductive structure.

32. The structure of claim 23, wherein said barrier layer and said conductive plug are made of different materials.

* * * * *